US010340910B2

(12) United States Patent
 Takida et al.

(10) Patent No.: US 10,340,910 B2
(45) Date of Patent: Jul. 2, 2019

(54) DRIVE CIRCUIT

(71) Applicants: Kabushiki Kaisha Toshiba, Minato-ku, Tokyo (JP); Toshiba Electronic Devices & Storage Corporation, Minato-ku, Tokyo (JP)

(72) Inventors: Takayuki Takida, Edogawa Tokyo (JP); Ryota Miwa, Kawasaki Kanagawa (JP); Takafumi Kiyono, Ota Gunma (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 0 days.

(21) Appl. No.: 15/923,294

(22) Filed: Mar. 16, 2018

(65) Prior Publication Data

US 2019/0089347 A1 Mar. 21, 2019

(30) Foreign Application Priority Data

Sep. 21, 2017 (JP) ................................. 2017-181532

(51) Int. Cl.
 *H03K 17/16* (2006.01)
 *H03K 5/13* (2014.01)
(52) U.S. Cl.
 CPC ............. *H03K 17/162* (2013.01); *H03K 5/13* (2013.01)

(58) Field of Classification Search
 None
 See application file for complete search history.

(56) References Cited

U.S. PATENT DOCUMENTS

| 8,310,284 | B2* | 11/2012 | Heck ................... H03K 17/063 327/108 |
| 8,841,940 | B2* | 9/2014 | Barrenscheen ..... H02M 3/3376 327/108 |
| 10,096,705 | B2* | 10/2018 | Nielsen ........... H01L 21/823892 |
| 2005/0144539 | A1* | 6/2005 | Orita ................ H03K 17/08122 714/48 |

FOREIGN PATENT DOCUMENTS

| JP | 2005-020392 A | 1/2005 |
| JP | 2012-130136 A | 7/2012 |
| JP | 2012-210023 A | 10/2012 |
| JP | 2016-086336 A | 5/2016 |

* cited by examiner

*Primary Examiner* — Jeffery S Zweizig
(74) *Attorney, Agent, or Firm* — White & Case LLP

(57) ABSTRACT

A drive circuit includes a first level shift circuit, a second level shift circuit, a pre-driver, and a high-side transistor. The first level shift circuit outputs a first switch signal. The second level shift circuit outputs a second switch signal. The pre-driver includes a first switch portion configured to perform switching in accordance with the first switch signal and a second switch portion configured to output a gate signal in accordance with the second switch signal. The high-side transistor outputs a high-side output signal to an output terminal with a second power supply voltage which is fed in accordance with the gate signal.

14 Claims, 7 Drawing Sheets

DRIVE CIRCUIT

CROSS-REFERENCE TO RELATED APPLICATIONS

This application is based upon and claims the benefit of priority from the Japanese Patent Application No. 2017-181532, filed on Sep. 21, 2017; the entire contents of which are incorporated herein by reference.

BACKGROUND

An embodiment described herein relates generally to a drive circuit.

A conventional internal floating power supply provided in a drive circuit which drives a load device may be composed of a source follower circuit to curb influence of noise caused by switching. If a size of a transistor is increased to improve power feed performance of the source follower circuit, an amount of drain-to-source current may change due to parasitic capacitance caused between a gate and a drain to destabilize a driving voltage for a gate of a high-side transistor which is composed of a high-withstand-voltage transistor, such as an n-type DMOS. When the driving voltage for the gate is destabilized, the high-side transistor cannot stably output a high-side output signal for driving the load device.

DETAILED DESCRIPTION

Embodiment

A drive circuit according to an embodiment includes a first level shift circuit, a second level shift circuit, a pre-driver, and a high-side transistor. The first level shift circuit receives an input high-side driving signal and outputs to a predetermined first signal level a first switch signal which is obtained by shifting the high-side driving signal. The second level shift circuit outputs a second switch signal which is obtained by shifting signal level of the high-side driving signal to a predetermined second signal level set to be not higher than the predetermined first signal level. The pre-driver includes a first switch portion which switches to either connection to or disconnection from a feed channel for a first power supply voltage in accordance with the first switch signal and a second switch portion which is connected to the first power supply voltage through switching by the first switch portion and outputs a gate signal in accordance with the second switch signal. The high-side transistor is connected to a second power supply voltage set to be lower than the first power supply voltage, generates a high-side output signal with the second power supply voltage that is fed in accordance with the gate signal, and outputs the high-side output signal to an output terminal.

The embodiment will be described below with reference to the drawings.

Figure 1:
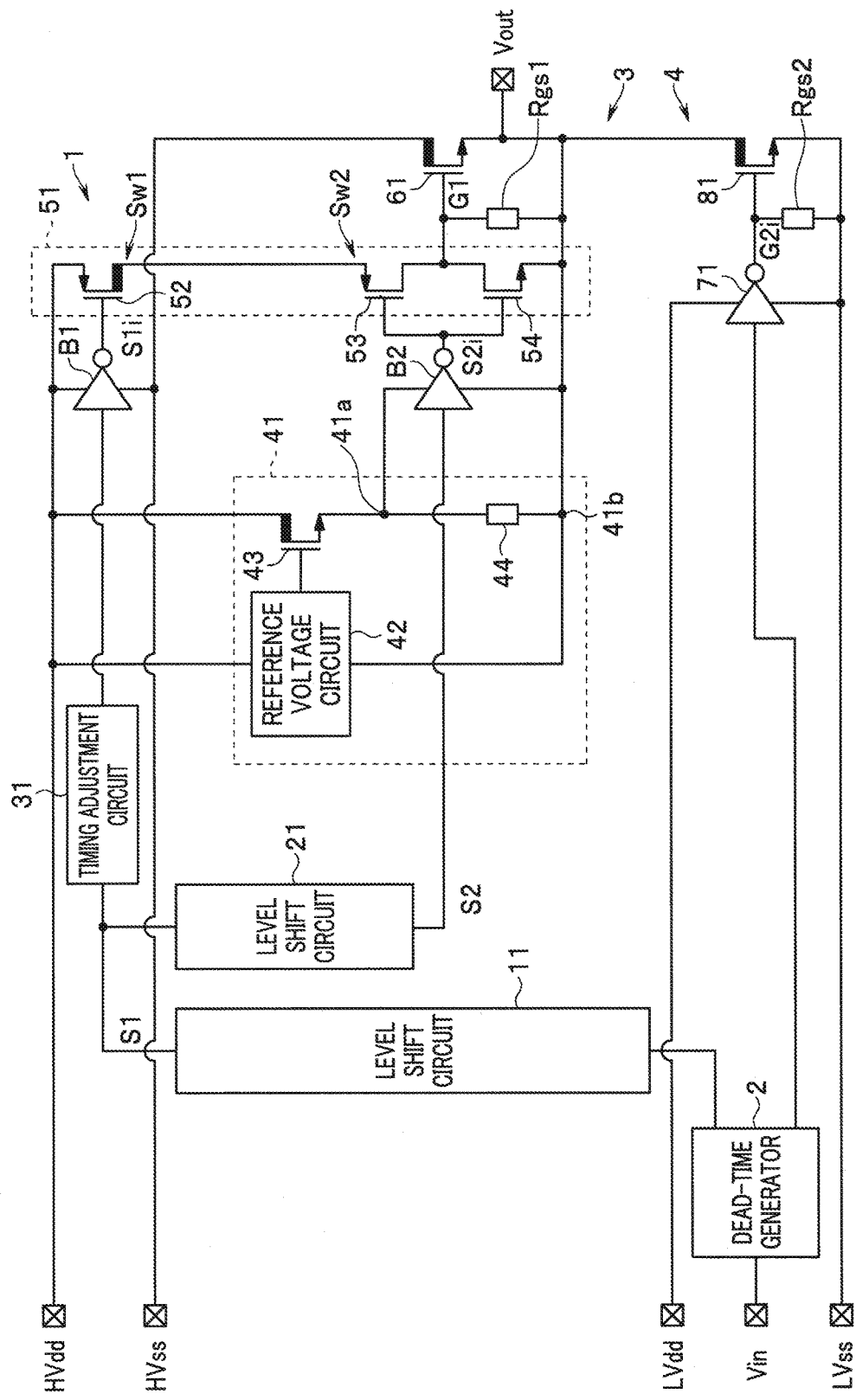
FIG. 1 is a circuit diagram of an example of a drive circuit according to an embodiment.
Figure 2:
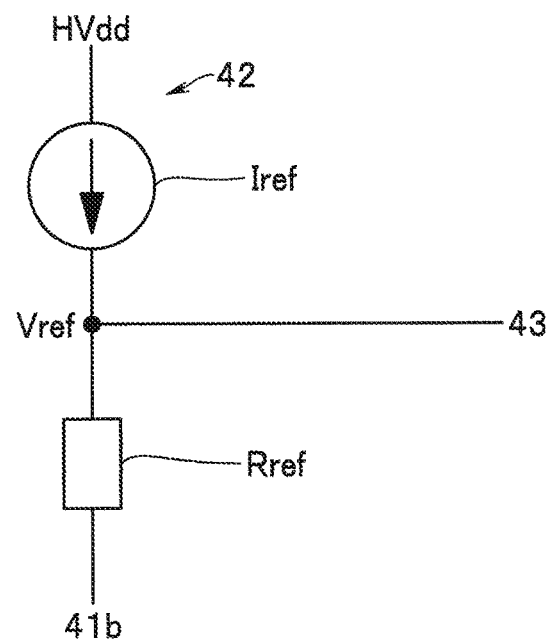
FIG. 2 is a circuit diagram of an example of a reference voltage circuit according to the embodiment.
Figure 3:
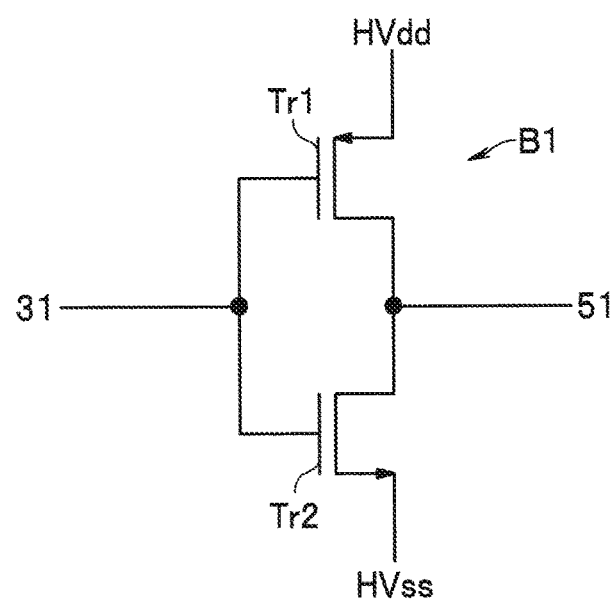
FIG. 3 is a circuit diagram of an example of an inverting buffer of the drive circuit according to the embodiment.
Figure 4:
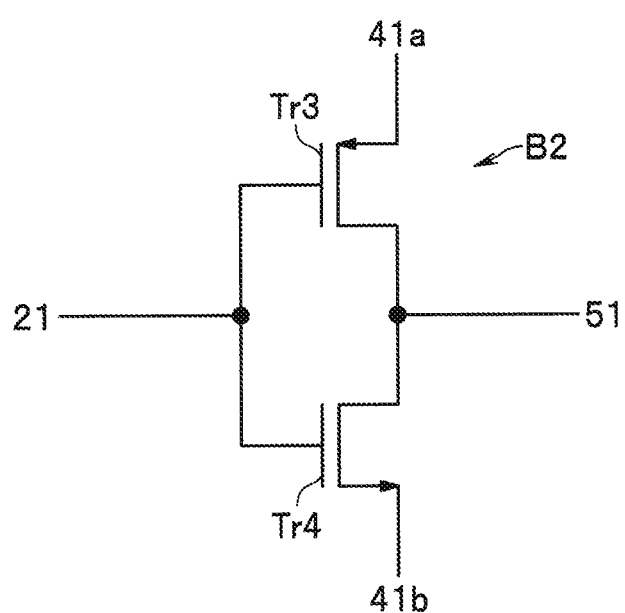
FIG. 4 is a circuit diagram of an example of an inverting buffer of the drive circuit according to the embodiment.

FIG. 1 is a circuit diagram of an example of a drive circuit 1 according to the embodiment. FIG. 2 is a circuit diagram of an example of a reference voltage circuit 42 according to the embodiment. FIG. 3 is a circuit diagram of an example of an inverting buffer B1 in the drive circuit 1 according to the embodiment. FIG. 4 is a circuit diagram of an example of an inverting buffer B2 in the drive circuit 1 according to the embodiment.

As shown in FIG. 1, a dead-time generator 2 is connected to an input terminal Vin, a high-side circuit 3, and a low-side circuit 4. The high-side circuit 3 and the low-side circuit 4 are connected to an output terminal Vout. A load device is connected to the output terminal Vout.

An input signal input to the input terminal Vin is, for example, a PWM signal. The input signal is not limited to a PWM signal and may be a signal, such as a PFM signal, a clock signal, or one of various types of pulse signals.

The dead-time generator 2 generates respective predetermined dead time periods for a high-side driving signal for driving the high-side circuit 3 and a low-side driving signal for driving the low-side circuit 4 which are generated on the basis of an input signal input from the input terminal Vin. Length of each of the predetermined dead time periods is experimentally or experientially set such that the high-side transistor 61 and the low-side transistor 81 are not turned on at the same time.

A configuration of the high-side circuit 3 will be described first.

The high-side circuit 3 is connected to the output terminal Vout and outputs a driving signal at high level to the output terminal Vout in accordance with the high-side driving signal. The high-side circuit 3 has a level shift circuit 11 which is a first level shift circuit, a level shift circuit 21 which is a second level shift circuit, a timing adjustment circuit 31, an internal power supply circuit 41, a pre-driver 51, a high-side transistor 61, and a gate-to-source resistor Rgs1. A first power supply voltage HVdd at a high potential and a second power supply voltage HVss at a low potential are connected to the high-side circuit 3.

The level shift circuit 11 is connected to the dead-time generator 2, the level shift circuit 21, and the timing adjustment circuit 31. The level shift circuit 11. receives the high-side driving signal input from the dead-time generator 2 and outputs to the level shift circuit 21 and the timing adjustment circuit 31 a switch signal S1 which is a first switch signal obtained by shifting the high-side driving signal to a predetermined first signal level.

The predetermined first signal level is a level between the first power supply voltage HVdd and the second power supply voltage HVss.

The switch signal S1 is made later by a predetermined first time period than the high-side driving signal through signal level shifting by the level shift circuit 11.

The level shift circuit 21 is connected in series with the level shift circuit 11 and shifts the switch signal S1 input from the level shift circuit 11 to a predetermined second signal level. The level shift circuit 21 is connected to the inverting buffer B2. The level shift circuit 21 outputs to the inverting buffer B2 a switch signal S2 which is a second switch signal obtained by shifting signal level of the high-side driving signal to the predetermined second signal level that is set to be not higher than the predetermined first signal level.

The predetermined second signal level is set to be higher than the signal level of the high-side driving signal and be not higher than the predetermined first signal level.

The switch signal S2 is made later by a predetermined second time period than the switch signal S1 through signal level shifting by the level shift circuit 21.

The timing adjustment circuit 31 is connected to the pre-driver 51 via the inverting buffer B1. The timing adjustment circuit 31 further makes the switch signal S1 input from the level shift circuit 11 later by a predetermined third time period and outputs the switch signal S1 to the inverting buffer B1. The predetermined third time period is experientially or experimentally set such that a high-withstand-voltage transistor 52 is turned on later than a switching transistor 53. For example, the predetermined third time period is set to be longer than the predetermined second time period. That is, the timing adjustment circuit 31 makes the switch signal S1 later than the switch signal S2.

The internal power supply circuit 41 is connected to the first power supply voltage HVdd and converts the first power supply voltage HVdd into an internal power supply voltage. In the internal power supply circuit 41, the first power supply voltage HVdd is connected to an input end, a high-potential input end of the inverting buffer B2 is connected to a high-voltage node 41a, and a low-potential input end of the inverting buffer B2 and the output terminal Vout are connected to a low-voltage node 41b. The internal power supply circuit 41 has a reference voltage circuit 42, a transistor 43, and a resistor 44.

As shown in FIG. 2, the reference voltage circuit 42 has a constant current source Iref and a reference resistor Rref which are connected in series with each other. The constant current source Iref has one end connected to the first power supply voltage HVdd and the other end connected to the reference resistor Rref. The reference resistor Rref has one end connected to the other end of the constant current source Iref and the other end connected to the low-voltage node 41b. A gate of the transistor 43 is connected between the constant current source Iref and the reference resistor Rref. The internal power supply circuit 41 outputs a reference voltage Vref which is produced by passing a current from the constant current source Iref through the reference resistor Rref to the transistor 43.

The transistor 43 is composed of a high-withstand-voltage MOSFET, such as an n-type DMOS. The transistor 43 has the gate connected to the reference voltage circuit 42, a drain connected to the first power supply voltage HVdd, and a source connected to the high-voltage node 41a. The transistor 43 operates as a source follower and outputs the reference voltage Vref fed from the reference voltage circuit 42 to the high-voltage node 41a.

The resistor 44 has one end connected to the source of the transistor 43 and the other end connected to the low-voltage node 41b. The resistor 44 stabilizes output from the high-voltage node 41a by stably passing current through the transistor 43.

As shown in FIG. 3, the inverting buffer B1 is composed of, for example, a MOSFET having a CMOS structure and has a p-type transistor Tr1 and an n-type transistor Tr2 which are connected in series with each other. Gates of the transistors Tr1 and Tr2 are connected to the timing adjustment circuit 31. A source of the transistor Tr1 is connected to the first power supply voltage HVdd. A source of the transistor Tr2 is connected to the second power supply voltage HVss. Drains of the transistors Tr1 and Tr2 are connected to the pre-driver 51. When the switch signal S1 is input from the level shift circuit 11, the inverting buffer B1 outputs to the pre-driver 51 a switch signal S1i which is a first switch signal obtained by inverting the switch signal S1.

As shown in FIG. 4, the inverting buffer B2 is composed of, for example, a MOSFET having a CMOS structure and has a p-type transistor Tr3 and an n-type transistor Tr4 which are connected in series with each other. Gates of the transistors Tr3 and Tr4 are connected to the level shift circuit 21. A source of the transistor Tr3 is connected to the high-voltage node 41a. A source of the transistor Tr4 is connected to the low-voltage node 41b. Drains of the transistors Tr3 and Tr4 are connected to the pre-driver 51. When the switch signal S2 is input from the level shift circuit 21, the inverting buffer B2 outputs to the pre-driver 51a switch signal S2i which is a second switch signal obtained by inverting the switch signal S2.

The pre-driver 51 is a circuit which outputs a gate signal G1 to the high-side transistor 61. The pre-driver 51 has the high-withstand-voltage transistor 52, the switching transistor 53 that is a first switching transistor and a switching transistor 54 which is a second switching transistor.

The high-withstand-voltage transistor 52 is a high-withstand-voltage MOSFET, such as a p-type DMOS. The high-withstand-voltage transistor 52 has a gate connected to the inverting buffer B1, a source connected to the first power supply voltage HVdd, and a drain connected to a source of the switching transistor 53. The high-withstand-voltage transistor 52 constitutes a switch portion Sw1 which is a first switch portion.

The switching transistors 53 and 54 are composed of, for example, a low-withstand-voltage MOSFET with a CMOS structure and are a p-type switching transistor and an n-type switching transistor which are connected in series with each other. The switching transistor 53 has higher transconductance than transconductance of the high-withstand-voltage transistor 52. Gates of the switching transistors 53 and 54 are connected to the inverting buffer B2. The source of the switching transistor 53 is connected to the drain of the high-withstand-voltage transistor 52. A source of the switching transistor 54 is connected to the low-voltage node 41b. Drains of the switching transistors 53 and 54 are connected to the high-side transistor 61. The switching transistors 53 and 54 constitute a switch portion Sw2 which is a second switch portion.

That is, the pre-driver 51 has the switch portion Sw1 that switches to either connection to or disconnection from a feed channel for the first power supply voltage HVdd in accordance with the switch signal S1i and the switch portion Sw2 that is connected to the first power supply voltage HVdd through switching by the switch portion Sw1 and outputs the gate signal G1 in accordance with the switch signal S2i.

The switch portion Sw1 is provided between the first power supply voltage HVdd and the switch portion Sw2 and has the high-withstand-voltage transistor 52 that receives the switch signal S1i input to the gate. The switch portion Sw2 has a low-withstand-voltage CMOS structure which includes the switching transistors 53 and 54 connected in series with each other. The switching transistor 53 is provided between the high-withstand-voltage transistor 52 and the high-side transistor 61 and receives the switch signal S2i input to the gate. The switch portion Sw2 receives an input driving voltage for the switch signal S2i which is generated on the basis of the internal power supply voltage.

The high-side transistor 61 is composed of a high-withstand-voltage MOSFET, such as an n-type DMOS. The high-side transistor 61 has a gate connected to the drains of the switching transistors 53 and 54, a source connected to the output terminal Vout, and a drain connected to the second power supply voltage HVss.

That is, the high-side transistor 61 is connected to the second power supply voltage HVss that is set to be lower than the first power supply voltage HVdd, generates a high-side output signal with the second power supply voltage HVss that is fed in accordance with the gate signal G1, and outputs the high-side output signal to the output terminal Vout.

The gate-to-source resistor Rgs1 is provided between the gate and the source of the high-side transistor 61 such that operation remains stable even when each of the switching transistors 53 and 54 produces Hi-Z output.

A configuration of the low-side circuit 4 will be described.

A third power supply voltage LVdd at a high potential and a fourth power supply voltage LVss at a low potential are connected to the low-side circuit 4. The fourth power supply voltage LVss is, for example, a ground voltage.

The low-side circuit 4 generates a low-side output signal with the ground voltage that is fed in accordance with the low-side driving signal and outputs the low-side output signal to the output terminal Vout. The low-side circuit 4 has an inverting buffer 71, a low-side transistor 81, and a gate-to-source resistor Rgs2.

The inverting buffer 71 is connected to the dead-time generator 2, the low-side transistor 81, the third power supply voltage LVdd, and the fourth power supply voltage LVss. The inverting buffer 71 inverts the low-side driving signal input from the dead-time generator 2 to generate a gate signal G2i and outputs the gate signal G2i to the low-side transistor 81.

The low-side transistor 81 is a high-withstand-voltage MOSFET, such as an n-type DMOS. The low-side transistor 81 has a gate connected to the inverting buffer 71, a source connected to the fourth power supply voltage LVss, and a drain connected to the output terminal Vout.

The gate-to-source resistor Rgs2 is provided between the gate and the source of the low-side transistor 81 such that operation of the low-side transistor 81 remains stable even when the inverting buffer 71 produces Hi-Z output.

Operation of Drive Circuit 1

Operation of the high-side circuit 3 will be described.

When the dead time generator 2 outputs the high-side driving signal at high level, the level shift circuit 11 generates the switch signal S1 at high level and outputs the switch signal S1 to the level shift circuit 21 and the timing adjustment circuit 31.

The level shift circuit 21 shifts signal level of the switch signal S1, generates the switch signal S2, and outputs the switch signal S2 to the inverting buffer B2. The switch signal S2 is later by the predetermined second time period than the switch signal S1.

When the switch signal S2 at high level is input, the transistor Tr3 is turned off, and the transistor Tr4 is turned on. The inverting buffer B2 outputs the switch signal S2i at low level that is fed from the low-voltage node 41b and turns on the switching transistor 53.

The timing adjustment circuit 31 performs timing adjustment by making the switch signal S1 later by the predetermined third time period and outputs the timing-adjusted switch signal S1 to the inverting buffer B1. With the timing adjustment by the timing adjustment circuit 31, the switch signal S1 is made later than the switch signal S2.

When the switch signal S1 at high level is input, the transistor Tr1 is turned off, and the transistor Tr2 is turned on. The inverting buffer B1 outputs the switch signal S1i at low level to the high-withstand-voltage transistor 52 to turn on the high-withstand-voltage transistor 52.

When the high-withstand-voltage transistor 52 and the switching transistor 53 are turned on, the gate signal G1 at a voltage limited by the switching transistor 53 is input to the high-side transistor 61. With the input, the high-side transistor 61 is turned on and outputs the high-side output signal based on the second power supply voltage HVss to the output terminal Vout.

When the dead-time generator 2 outputs the high-side driving signal at low level, the high-withstand-voltage transistor 52 and the switching transistor 53 are turned off, and the switching transistor 54 is turned on. The high-side transistor 61 is turned off to break connection between the second power supply voltage HVss and the output terminal Vout.

Operation of the low-side circuit 4 will be described.

When the dead-time generator 2 outputs the low-side driving signal at high level, the inverting buffer 71 outputs the gate signal G2i at low level that is fed from the fourth power supply voltage LVss to the low-side transistor 81. The low-side transistor 81 is turned off to break connection between the fourth power supply voltage LVss and the output terminal Vout.

On the other hand, when the dead-time generator 2 outputs the low-side driving signal at low level, the inverting buffer 71 outputs the gate signal G2i at high level that is fed from the third power supply voltage LVdd to the low-side transistor 81. The low-side transistor 81 is turned on and outputs to the output terminal Vout the low-side output signal based on the fourth power supply voltage LVss connected to the source.

That is, the drive circuit 1 controls the high-side circuit 3 connected to a high potential and the low-side circuit 4 connected to a low potential in accordance with an input signal, generates an output signal by causing the high-side transistor 61 and the low-side transistor 81 to alternate in operating, and drives the load device.

The drive circuit 1 is configured such that the switching transistor 53 is turned on earlier than the high-withstand-voltage transistor 52, is configured such that the transconductance of the switching transistor 53 is higher than the transconductance of the high-withstand-voltage transistor 52, and can prevent a gate-to-source voltage of the switching transistor 53 from exceeding a withstand voltage.

The drive circuit 1 can be made smaller by constructing the switching transistors 53 and 54 such that the switching transistors 53 and 54 have a low-withstand-voltage CMOS structure.

The drive circuit 1 can cancel out the predetermined first time period due to the level shift circuit 11 and perform timing adjustment of the switch signal S1 and the switch signal S2.

A voltage of an internal floating power supply which is generated by a bootstrap technique, a charge pump technique, or the like may be applied to a gate of a conventional high-side transistor. In contrast, in the drive circuit 1, a voltage of the gate signal G1 generated by power which is fed from the first power supply voltage HVdd is applied to the gate of the high-side transistor 61.

According to the embodiment, the drive circuit 1 can feed the more stable gate signal G1 to the gate of the high-side transistor 61 and stably output the high-side output signal for driving the load device.

First Modification of Embodiment

Although the switch portion Sw2 has the switching transistors 53 and 54 with a CMOS structure in the embodiment, a switch portion Sw2a which is a second switch portion may have a source follower transistor 53a and the switching transistor 54.

Figure 5:
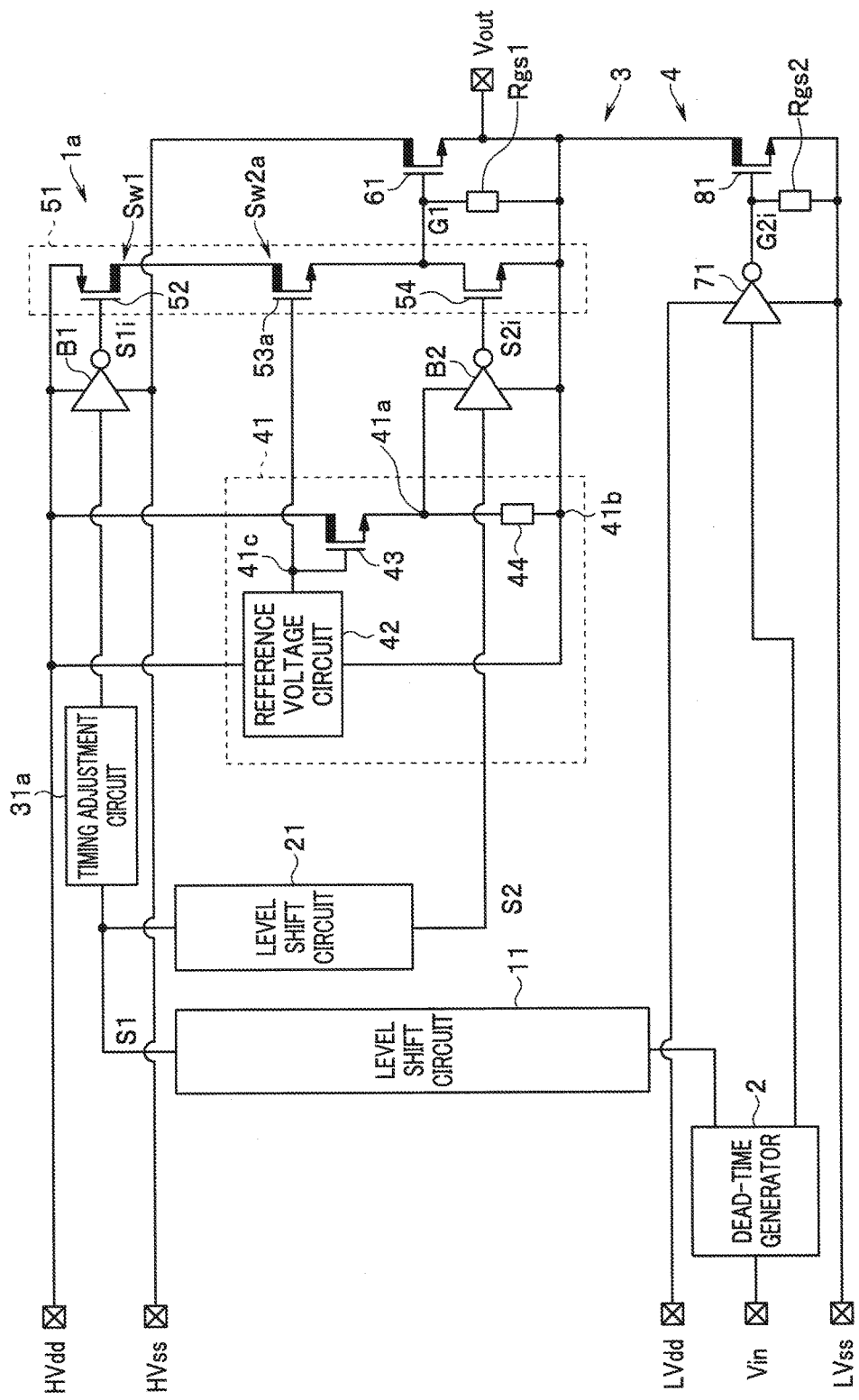
FIG. 5 is a circuit diagram of an example of a drive circuit according to a first modification of the embodiment.

FIG. 5 is a circuit diagram of an example of a drive circuit 1a according to a first modification of the embodiment. In the present modification, a description of the same components as components in other modifications will be omitted.

A timing adjustment circuit 31a further makes the switch signal S1 input from the level shift circuit 11 later by a predetermined fourth time period and outputs the switch signal S1 to the inverting buffer B1. The predetermined fourth time period is experientially or experimentally set such that the high-withstand-voltage transistor 52 and the switching transistor 54 operate in synchronization. For example, the predetermined fourth time period is set to a time period equal or close to the predetermined second time period. That is, the timing adjustment circuit 31a performs timing adjustment of the switch signals S1 and S2 such that the high-withstand-voltage transistor 52 and the switching transistor 54 are not turned on at the same time.

The pre-driver 51 has the source follower transistor 53a between the high-withstand-voltage transistor 52 and the switching transistor 54.

The source follower transistor 53a is a high-withstand-voltage MOSFET, such as an n-type DMOS. The source follower transistor 53a has a gate connected to a reference voltage node 41c of the internal power supply circuit 41, a drain connected to a drain of the high-withstand-voltage transistor 52, and a source connected to a drain of the switching transistor 54. A gate of the high-side transistor 61 is connected between the source follower transistor 53a and the switching transistor 54.

The inverting buffer B2 is connected to a gate of the switching transistor 54.

When the dead-time generator 2 outputs a high-side driving signal at high level, the level shift circuit 11 generates the switch signal S1 at high level and outputs the switch signal S1 to the level shift circuit 21 and the timing adjustment circuit 31a.

The timing adjustment circuit 31a makes the switch signal S1 later by the predetermined fourth time period and outputs the timing-adjusted switch signal S1 to the inverting buffer B1. With the timing adjustment by the timing adjustment circuit 31a, the switch signal S1 is adjusted in timing with respect to the switch signal S2 such that the high-withstand-voltage transistor 52 and the switching transistor 54 are not turned on at the same time.

When the switch signal S1 at high level is input, the inverting buffer B1 outputs the switch signal S1i at low level to the high-withstand-voltage transistor 52 to turn on the high-withstand-voltage transistor 52. The drain of the source follower transistor 53a is connected to the drain of the high-withstand-voltage transistor 52, and the source follower transistor 53a outputs a source voltage in accordance with the reference voltage Vref that is input to the gate.

The level shift circuit 21 shifts signal level of the switch signal S1, generates the switch signal S2, and outputs the switch signal S2 to the inverting buffer B2.

When the switch signal S2 at high level is input, the inverting buffer B2 outputs the switch signal S2i at low level to turn off the switching transistor 54.

When the high-withstand-voltage transistor 52 is turned on, and the switching transistor 54 is turned off, the gate signal corresponding to the source voltage of the source follower transistor 53a is input to the high-side transistor 61. With the input, the high-side transistor 61 is turned on and outputs a driving signal based on the second power supply voltage HVss to the output terminal Vout.

When the dead-time generator 2 outputs the high-side driving signal at low level, the switching transistor 54 is turned on to lower a voltage of the gate signal G1. The high-withstand-voltage transistor 52 is turned off to break connection between the first power supply voltage HVdd and the source follower transistor 53a. The high-side transistor 61 is turned off to break connection between the second power supply voltage HVss and the output terminal Vout.

That is, the drive circuit 1a has the internal power supply circuit 41. The internal power supply circuit 41 is connected to the first power supply voltage HVdd and converts the first power supply voltage HVdd into the reference voltage Vref. The switch portion Sw1 is provided between the first power supply voltage HVdd and the switch portion Sw2a and has the high-withstand-voltage transistor 52 that receives the switch signal S1i input to a gate. The switch portion Sw2a has the source follower transistor 53a that has the gate, to which the reference voltage Vref is input, the drain connected to the high-withstand-voltage transistor 52, and the source connected to the high-side transistor 61 and the switching transistor 54 that is provided between the source of the source follower transistor 53a and the low-voltage node 41b and performs switching in accordance with the switch signal S2i.

With the configuration, the drive circuit 1a can feed the more stable gate signal G1 to the gate of the high-side transistor 61 and stably output a high-side output signal for driving a load device.

In the drive circuit 1a, the source follower transistor 53a adjusts an output voltage to prevent breakage of the pre-driver 51, flexibility in setting transconductance of a transistor inside the pre-driver 51 improves, and adjustment of operation timing is easier.

Second Modification of Embodiment

Although the level shift circuit 21 is connected in series with the level shift circuit 11 in the embodiment and the first modification of the embodiment, a level shift circuit 21a may be connected in parallel with the level shift circuit 11.

Figure 6:
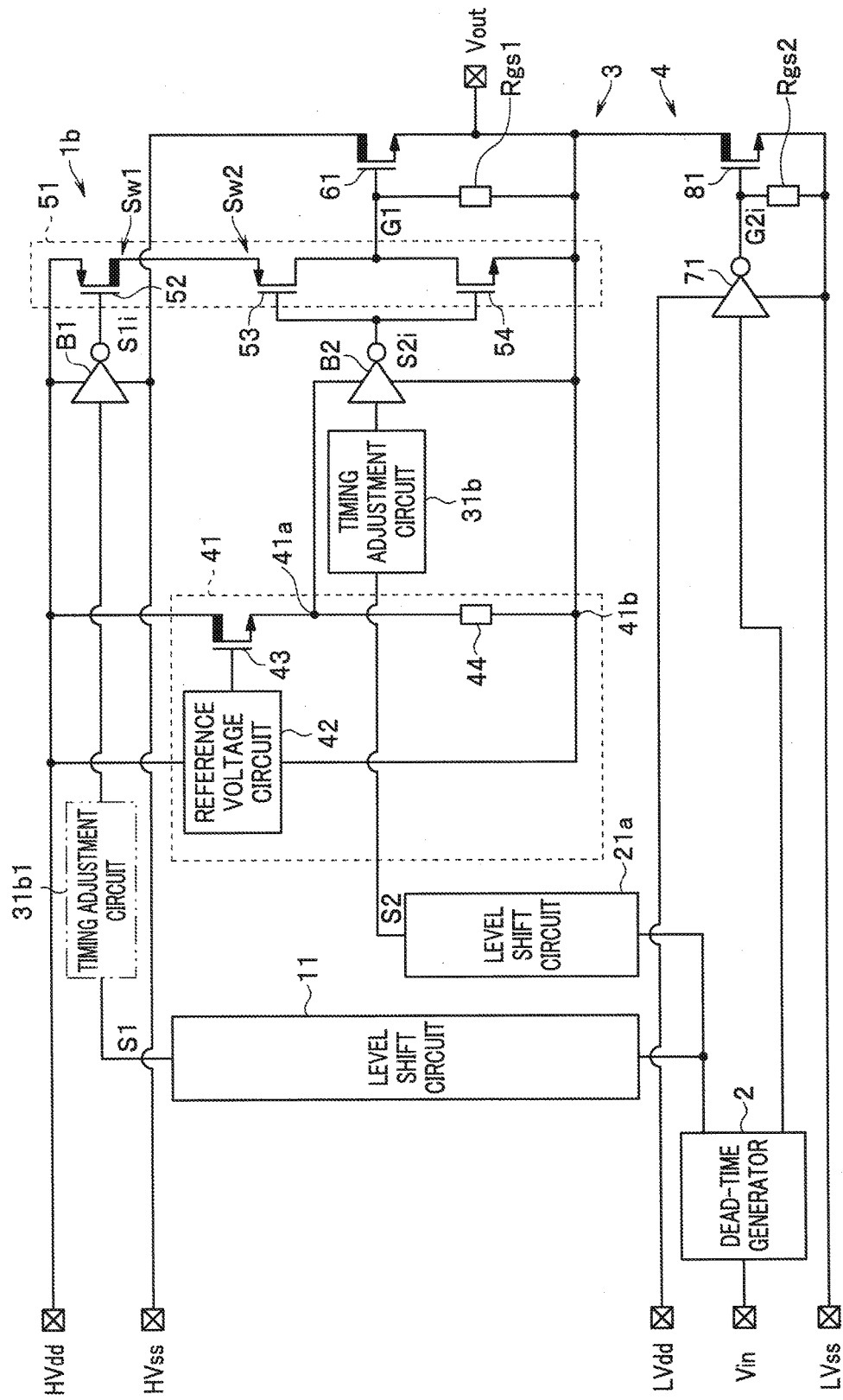
FIG. 6 is a circuit diagram of an example of a drive circuit according to a second modification of the embodiment.

FIG. 6 is a circuit diagram of an example of a drive circuit 1b according to a second modification of the embodiment. In the present modification, a description of the same components as components in other modifications will be omitted.

The drive circuit 1b has the level shift circuit 21a and a timing adjustment circuit 31b.

The level shift circuit 21a is connected to the dead-time generator 2 to be in parallel with the level shift circuit 11 such that a high-side driving signal is input, shifts the high-side driving signal to a predetermined second signal level, and generates the switch signal S2 and outputs the switch signal S2 to the timing adjustment circuit 31b.

The switch signal S2 is made later by a predetermined second time period than the switch signal S1 through signal level shifting by the level shift circuit 21a.

The timing adjustment circuit 31b is connected to the pre-driver 51 via the inverting buffer B2. The timing adjustment circuit 31b makes the switch signal S2 input from the level shift circuit 21a later by a predetermined fifth time period and outputs the switch signal S2 to the inverting buffer B2. The predetermined fifth time period is experientially or experimentally set such that a time when the high-withstand-voltage transistor 52 is turned on is not much later than a time when the switching transistor 53 is turned on and such that the high-withstand-voltage transistor 52 is turned on later than the switching transistor 53. For example, the predetermined fifth time period is set to a time period shorter than a difference between the predetermined first time period and the predetermined second time period.

Note that, although the time when the high-withstand-voltage transistor 52 is turned on and the time when the switching transistor 53 is turned on are adjusted by the timing adjustment circuit 31b in the second modification of the embodiment, a timing adjustment circuit 31b1 may be further provided, and the switch signal S1 input from the level shift circuit 11 may be made later by a predetermined time period and be output to the inverting buffer B1 (a chain double-dashed line in FIG. 6). The predetermined time period is experientially or experimentally set such that the time when the high-withstand-voltage transistor 52 is turned on is not much later than the time when the switching transistor 53 is turned on and such that the high-withstand-voltage transistor 52 is turned on later than the switching transistor 53.

With the configuration, the drive circuit 1b can feed the more stable gate signal G1 to a gate of the high-side transistor 61 and stably output a high-side output signal for driving a load device.

The drive circuit 1b can also more easily perform timing adjustment of the low-side circuit 4 with reference to the predetermined first time period.

Third Modification of Embodiment

The drive circuit 1a has the switch portion Sw2a in the first modification of the embodiment, and the drive circuit 1b has the level shift circuit 21a and the timing adjustment circuit 31b in the second modification of the embodiment. A drive circuit 1c may have a switch portion Sw2a, a level shift circuit 21a, and a timing adjustment circuit 31c.

Figure 7:
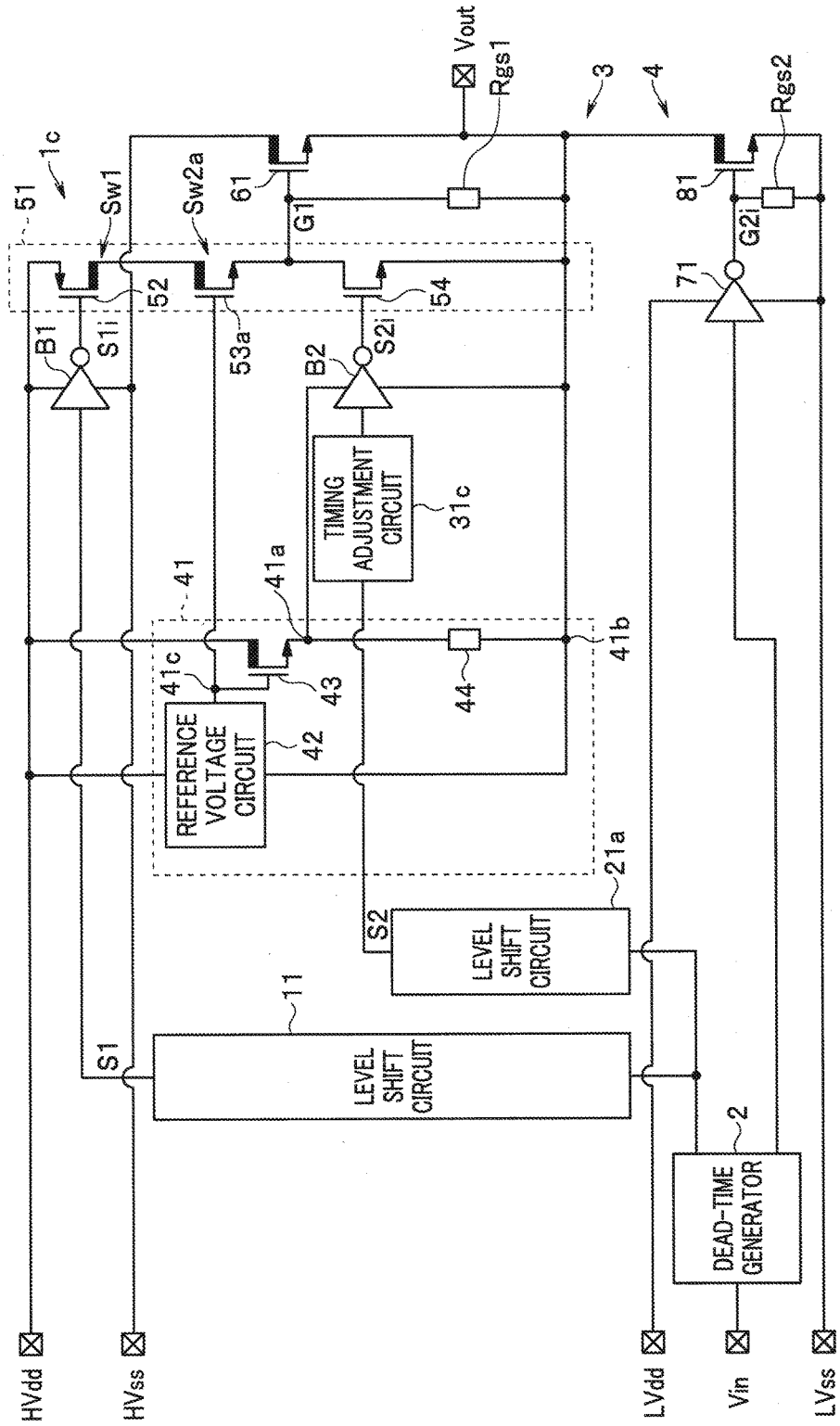
FIG. 7 is a circuit diagram of an example of a drive circuit according to a third modification of the embodiment.

FIG. 7 is a circuit diagram of an example of the drive circuit 1c according to a third modification of the embodiment. In the present modification, a description of same components as components in other modifications will be omitted.

As shown in FIG. 7, the drive circuit 1c has the switch portion Sw2a, the level shift circuit 21a, and the timing adjustment circuit 31c.

The timing adjustment circuit 31c is connected to the pre-driver 51 via the inverting buffer B2. The timing adjustment circuit 31c makes the switch signal S2 input from the level shift circuit 21a later by a predetermined sixth time period and outputs the switch signal S2 to the inverting buffer B2. The predetermined sixth time period is experientially or experimentally set such that the high-withstand-voltage transistor 52 and the switching transistor 54 operate in synchronization.

With the configuration, the drive circuit 1c can feed the more stable gate signal G1 to a gate of the high-side transistor 61 and stably output a high-side output signal for driving a load device.

In the drive circuit 1c, a source follower transistor 53a adjusts an output voltage to prevent breakage of the pre-driver 51, flexibility in setting transconductance of a transistor inside the pre-driver 51 improves, and adjustment of operation timing is easier. The drive circuit 1c can also more easily perform timing adjustment of the low-side circuit 4 with reference to the predetermined first time period.

Fourth Modification of Embodiment

Although the low-side circuit 4 has the low-side transistor 81 in the embodiment and the first to third modifications of the embodiment, the low-side circuit 4 may not have the low-side transistor 81.

Figure 8:
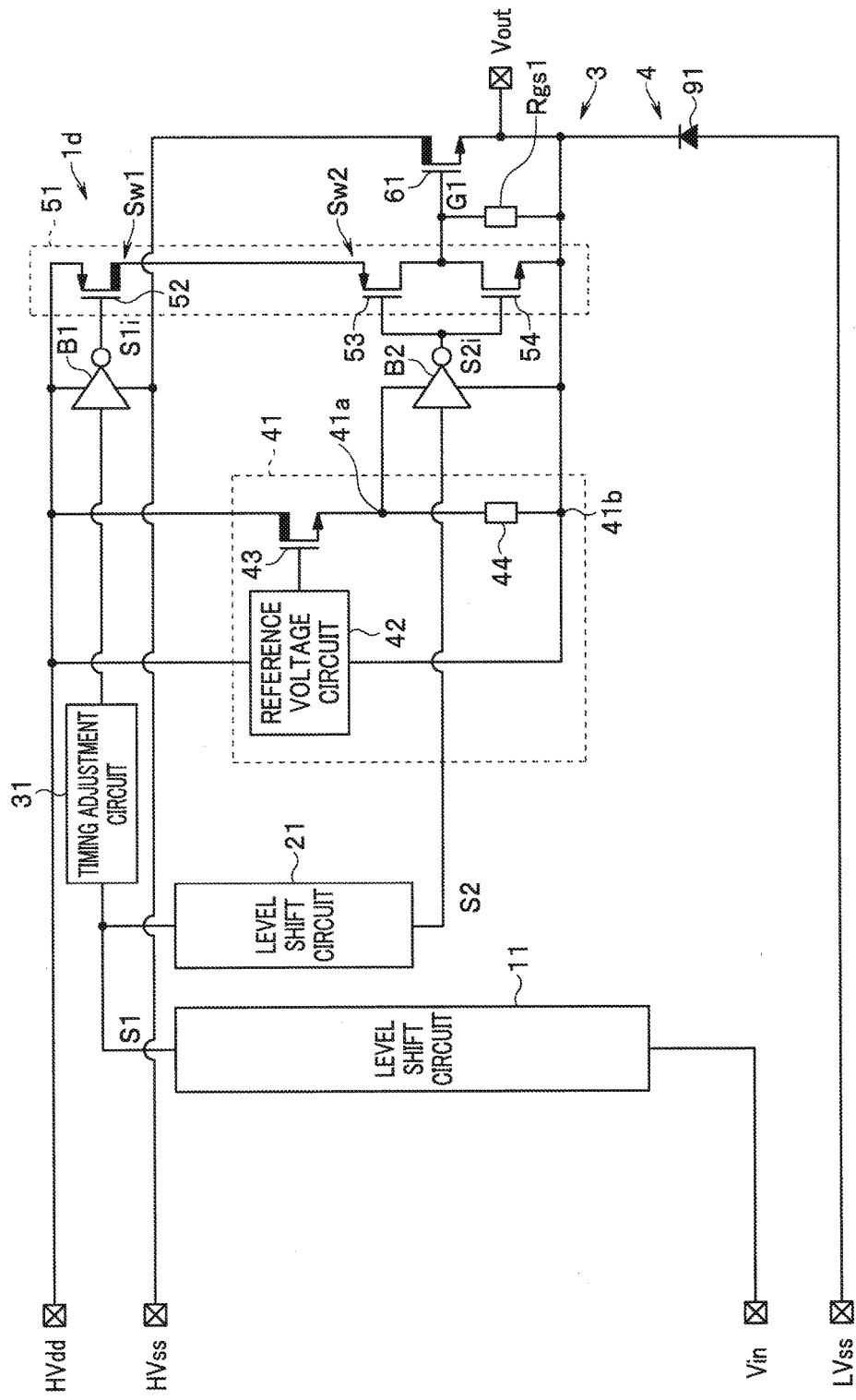
FIG. 8 is a circuit diagram of an example of a drive circuit according to a fourth modification of the embodiment.

FIG. 8 is a circuit diagram of an example of a drive circuit 1d according to a fourth modification of the embodiment. In the present modification, a description of the same components as components in other modifications will be omitted.

The drive circuit 1d has a diode 91.

The diode 91 has an anode connected to the fourth power supply voltage LVss and a cathode connected to the output terminal Vout.

With the configuration, the drive circuit 1d can feed the more stable gate signal G1 to a gate of the high-side transistor 61 and stably output a driving signal for driving a load device.

The drive circuit 1d can be constructed using a simpler circuit.

Note that the drive circuits 1, 1a, 1b, 1c, and 1d according to the embodiment and the modifications can be applied to, for example, a DC-DC converter, a motor driver, or a class D amplifier driver.

Note that the high-withstand-voltage transistor 52 and the switching transistors 53 and 54 may have a polarity opposite to a polarity in the embodiment and the modifications. In the case, an inverting circuit is provided between the inverting buffers B1, B2 and the pre-driver 51 to further invert the switch signals S1i and S2i output from the inverting buffers B1 and B2.

The embodiment of the present invention has been described. The embodiment, however, is illustrative and is not intended to limit the scope of the present invention. The new embodiment can be carried out in various other forms, and various omissions, replacements, and changes may be made without departing from the gist of the invention. The embodiment and the modifications of the embodiment are included in the scope and gist of the invention and are also included in the invention described in the claims and the scope of equivalents of the claims.

What is claimed is:

1. A drive circuit comprising:
  a first level shift circuit configured to receive an input high-side driving signal and output a first switch signal which is obtained by shifting the high-side driving signal to a predetermined first signal level;
  a second level shift circuit configured to output a second switch signal which is obtained by shifting signal level of the high-side driving signal to a predetermined second signal level set to be not higher than the predetermined first signal level;
  a pre-driver including a first switch portion which switches to either connection to or disconnection from a feed channel for a first power supply voltage in accordance with the first switch signal and a second switch portion which is connected to the first power supply voltage through switching by the first switch portion and outputs a gate signal in accordance with the second switch signal; and a high-side transistor connected to a second power supply voltage set to be lower than the first power supply voltage and configured to generate a high-side output signal with the second power supply voltage that is fed in accordance with the gate signal and output the high-side output signal to an output terminal.

2. The drive circuit according to claim 1, wherein
the first switch portion is provided between the first power supply voltage and the second switch portion and includes a high-withstand-voltage transistor which receives the first switch signal input to a gate,
the second switch portion includes a CMOS structure including a first switching transistor and a second switching transistor which are connected in series with each other, and
the first switching transistor is provided between the high-withstand-voltage transistor and the high-side transistor and receives the second switch signal input to a gate.

3. The drive circuit according to claim 2, wherein
the first switching transistor includes transconductance higher than transconductance of the high-withstand-voltage transistor.

4. The drive circuit according to claim 1, further comprising
a timing adjustment circuit, wherein
the timing adjustment circuit makes the first switch signal later than the second switch signal.

5. The drive circuit according to claim 1, further comprising an internal power supply circuit, wherein
the internal power supply circuit is connected to the first power supply voltage and converts the first power supply voltage into an internal power supply voltage, and
the second switch portion receives an input driving voltage for the second switch signal which is generated from the internal power supply voltage.

6. The drive circuit according to claim 1, further comprising
an internal power supply circuit, wherein
the internal power supply circuit is connected to the first power supply voltage and converts the first power supply voltage into a reference voltage,
the first switch portion is provided between the first power supply voltage and the second switch portion and includes a high-withstand-voltage transistor which receives the first switch signal input to a gate, and
the second switch portion includes a source follower transistor which receives the reference voltage input to a gate and includes a drain connected to the high-withstand-voltage transistor and a source connected to the high-side transistor and a switching transistor which is connected between the source of the source follower transistor and a low-potential node and performs switching in accordance with the second switch signal.

7. The drive circuit according to claim 1, further comprising
a dead-time generator configured to generate predetermined dead time periods for the high-side driving signal and a low-side driving signal respectively to drive a low-side circuit which are generated on the basis of an input signal input from an input terminal, wherein the low-side circuit generates a low-side output signal with a ground voltage which is fed in accordance with the low-side driving signal and outputs the low-side output signal to the output terminal.

8. A drive circuit, comprising:
a first level shift circuit configured to receive an input high-side driving signal and output a first switch signal which is obtained by shifting the high-side driving signal to a predetermined first signal level;
a second level shift circuit connected in series with the first level shift circuit such that the first switch signal is input from the first level shift circuit, and configured to output a second switch signal which is obtained by shifting the first switch signal input from the first level shift circuit to a predetermined second signal level set to be not higher than the predetermined first signal level;
a pre-driver including a first switch portion which switches to either connection to or disconnection from a feed channel for a first power supply voltage in accordance with the first switch signal and a second switch portion which is connected to the first power supply voltage through switching by the first switch portion and outputs a gate signal in accordance with the second switch signal; and
a high-side transistor connected to a second power supply voltage set to be lower than the first power supply voltage and configured to generate a high-side output signal with the second power supply voltage that is fed in accordance with the gate signal and output the high-side output signal to an output terminal.

9. The drive circuit according to claim 8, wherein
the first switch portion is provided between the first power supply voltage and the second switch portion and includes a high-withstand-voltage transistor which receives the first switch signal input to a gate,
the second switch portion includes a CMOS structure including a first switching transistor and a second switching transistor which are connected in series with each other, and
the first switching transistor is provided between the high-withstand-voltage transistor and the high-side transistor and receives the second switch signal input to a gate.

10. The drive circuit according to claim 9, wherein
the first switching transistor includes transconductance higher than transconductance of the high-withstand-voltage transistor.

11. The drive circuit according to claim 8, further comprising
a timing adjustment circuit, wherein
the timing adjustment circuit makes the first switch signal later than the second switch signal.

12. The drive circuit according to claim 8, further comprising
an internal power supply circuit, wherein
the internal power supply circuit is connected to the first power supply voltage and converts the first power supply voltage into an internal power supply voltage, and
the second switch portion receives an input driving voltage for the second switch signal which is generated from the internal power supply voltage.

13. The drive circuit according to claim 8, further comprising
an internal power supply circuit, wherein the internal power supply circuit is connected to the first power supply voltage and converts the first power supply voltage into a reference voltage, the first switch portion is provided between the first power supply voltage and the second switch portion and includes a high-withstand-voltage transistor which receives the first switch signal input to a gate, and the second switch portion includes a source follower transistor which receives the reference voltage input to a gate and includes a drain connected to the high-withstand-voltage transistor and a source connected to the high-side transistor and a switching transistor which is connected between the source of the source follower transistor and a low-potential node and performs switching in accordance with the second switch signal.

14. The drive circuit according to claim 8, further comprising a dead time generator configured to generate predetermined dead time periods for the high-side driving signal and a low-side driving signal respectively to drive a low-side circuit which are generated on the basis of an input signal input from an input terminal, wherein the low-side circuit generates a low-side output signal with a ground voltage which is fed in accordance with the low-side driving signal and outputs the low-side output signal to the output terminal.

* * * * *